US009362396B2

(12) United States Patent
Fukui et al.

(10) Patent No.: US 9,362,396 B2
(45) Date of Patent: *Jun. 7, 2016

(54) SEMICONDUCTOR DEVICE, MANUFACTURING METHOD THEREOF, ELECTRONIC DEVICE AND VEHICLE

(71) Applicant: Renesas Electronics Corporation, Kawasaki-shi (JP)

(72) Inventors: Yuki Fukui, Kawasaki (JP); Hiroaki Katou, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/733,566

(22) Filed: Jun. 8, 2015

(65) Prior Publication Data

US 2015/0270392 A1    Sep. 24, 2015

Related U.S. Application Data

(60) Continuation of application No. 14/196,986, filed on Mar. 4, 2014, now Pat. No. 9,082,835, which is a division of application No. 13/488,282, filed on Jun. 4, 2012, now Pat. No. 8,723,295.

(30) Foreign Application Priority Data

Jun. 6, 2011  (JP) ................................. 2011-126537

(51) Int. Cl.
*H01L 29/76* (2006.01)
*H01L 29/78* (2006.01)
(Continued)

(52) U.S. Cl.
CPC .......... *H01L 29/7827* (2013.01); *H01L 27/088* (2013.01); *H01L 29/0847* (2013.01);
(Continued)

(58) Field of Classification Search
CPC ............ H01L 29/7813; H01L 29/4236; H01L 29/1095; H01L 29/66734; H01L 29/0696

USPC ......................................... 257/279, 328–330
See application file for complete search history.

(56) References Cited

U.S. PATENT DOCUMENTS 4,929,884 A    5/1990  Bird et al.
6,495,871 B2 * 12/2002  Hattori ................ H01L 29/1095
                                                    257/279
(Continued)

FOREIGN PATENT DOCUMENTS

JP       59-032163 A     2/1984
JP       63-311418 A    12/1988
(Continued)

OTHER PUBLICATIONS

United States Office Action dated May 23, 2013, in U.S. Appl. No. 13/488,282.
(Continued)

*Primary Examiner* — Quoc Hoang
(74) *Attorney, Agent, or Firm* — McGinn IP Law Group, PLLC

(57) ABSTRACT

A method for manufacturing a semiconductor device, includes forming a recess over a surface of an n-type semiconductor substrate, forming a gate insulation film over an inner wall and a bottom face of the recess, embedding a gate electrode into the recess, forming a p-type base layer in a surface layer of the semiconductor substrate so as to be shallower than the recess, and forming an n-type source layer in the p-type base layer so as to be shallower than the p-type base layer. An impurity profile of the p-type base layer in a thickness direction includes a first peak, a second peak being located closer to a bottom face side of the semiconductor substrate than the first peak and being higher than the first peak, and a third peak located between the first peak and the second peak by implanting impurity ions three times or more at ion implantation energies different from each other in the forming of the p-type base layer.

12 Claims, 16 Drawing Sheets

(51) Int. Cl.

| | |
|---|---|
| *H01L 29/10* | (2006.01) |
| *H01L 29/66* | (2006.01) |
| *H01L 29/739* | (2006.01) |
| *H01L 27/088* | (2006.01) |
| *H01L 29/778* | (2006.01) |
| *H01L 29/08* | (2006.01) |
| H01L 29/417 | (2006.01) |
| H01L 29/423 | (2006.01) |
| H01L 21/8234 | (2006.01) |
| H01L 27/092 | (2006.01) |

(52) U.S. Cl.
CPC ........ *H01L29/1095* (2013.01); *H01L 29/4236* (2013.01); *H01L 29/66666* (2013.01); *H01L 29/66734* (2013.01); *H01L 29/7397* (2013.01); *H01L 29/7788* (2013.01); *H01L 29/7811* (2013.01); *H01L 29/7813* (2013.01); *H01L 21/823487* (2013.01); *H01L 27/0922* (2013.01); *H01L 29/41741* (2013.01); *H01L 29/42372* (2013.01); *H01L 29/78* (2013.01)

(56) References Cited

U.S. PATENT DOCUMENTS

| 6,605,858 | B2 | 8/2003 | Hattori |
| 6,670,658 | B2 | 12/2003 | Hattori et al. |
| 6,921,687 | B2 | 7/2005 | Hattori et al. |
| 7,041,559 | B2 | 5/2006 | Baliga |
| 7,056,779 | B2 | 6/2006 | Hattori |
| 7,061,047 | B2 | 6/2006 | Ono et al. |
| 8,193,564 | B2 | 6/2012 | Suzuki et al. |
| 8,723,295 | B2 * | 5/2014 | Fukui .................. H01L 29/1095 257/592 |
| 2003/0089966 | A1 | 5/2003 | Hattori et al. |
| 2005/0062064 | A1 | 3/2005 | Hattori et al. |
| 2006/0054970 | A1 | 3/2006 | Yanagida et al. |
| 2006/0160310 | A1 | 7/2006 | Miyata et al. |
| 2009/0153117 | A1 | 6/2009 | Yabe et al. |
| 2010/0079920 | A1 | 4/2010 | Fanic |
| 2010/0102857 | A1 | 4/2010 | Aoki et al. |

FOREIGN PATENT DOCUMENTS

| JP | 09-129868 A | 5/1997 |
| JP | 2001-250947 A | 9/2001 |
| JP | 2004-221201 A | 8/2004 |
| JP | 2006-080177 A | 3/2006 |
| JP | 2006-229181 A | 8/2006 |
| JP | 2007-173878 A | 7/2007 |
| JP | 2007-294759 A | 11/2007 |

OTHER PUBLICATIONS

United States Office Action dated Jul. 22, 2013, in U.S. Appl. No. 13/488,282.

United States Notice of Allowance dated Nov. 7, 2013, in U.S. Appl. No. 13/488,282.

Japanese Office Action dated Dec. 9, 2014, with an English translation.

* cited by examiner

| | EXAMPLE | COMPARATIVE EXAMPLE | |
|---|---|---|---|
| | | NO p3 (400 keV) (COMPARATIVE EXAMPLE 1) | NO p1 (200 keV) (COMPARATIVE EXAMPLE 2) |
| DUMP SURGE CAPACITY [V] | 60V (※60V OR MORE) | 57V | 46V |
| hfe | 1 | 1.09 | 1.22 |

SEMICONDUCTOR DEVICE, MANUFACTURING METHOD THEREOF, ELECTRONIC DEVICE AND VEHICLE

CROSS-REFERENCE TO RELATED APPLICATIONS

This application is a Continuation application of U.S. patent application Ser. No. 14/196,986 filed on Mar. 4, 2014, which is a Divisional patent application Ser. No. 13/488,282 filed on Jun. 4, 2012, now U.S. Pat. No. 8,723,295, which is based on and claims priority from Japanese Patent Application No. 2011-126537, filed on Jun. 6, 2011, the entire contents of which is incorporated herein by reference.

BACKGROUND

The present invention relates to a semiconductor device having a vertical-type transistor, a manufacturing method of the semiconductor device, an electronic device, and a vehicle.

As one of semiconductor devices, there is a semiconductor device having a vertical-type transistor. A vertical-type transistor is used as an element to control a large current for example. Some of the vertical-type transistors have trench-gate structures. Such a transistor having a trench-gate structure has a configuration where a p-type layer to act as a channel layer is formed over an n-type layer to act as a drain and further an n-type layer to act as a source is formed in the surface layer of the p-type layer, as shown in Patent Literatures 1 and 2 for example. A gate electrode of a trench structure extends from the p-type layer toward the n-type layer. Then, the bottom end of the gate electrode enters the n-type layer. In Patent Literatures 1 and 2, the concentration profile of the p-type layer to act as a channel layer in the depth direction has two peaks.

PREVIOUS TECHNICAL LITERATURE

Patent Literature

[Patent Literature 1]
Japanese Unexamined Patent Publication No. 2007-294759
[Patent Literature 2]
Japanese Unexamined Patent Publication No. 2007-173878

SUMMARY

One of the indices representing the performance of a vertical-type transistor is the width of an SOA (Safe Operating Area) (refer to FIG. 18) in a graph showing a Vd-Id characteristic. That is, it is necessary to inhibit an SOA from narrowing in a vertical-type transistor.

The present invention makes it possible to provide a semiconductor device having a semiconductor substrate, an n-type drain layer formed in the semiconductor substrate and located on the bottom face side of the semiconductor substrate, a p-type base layer formed in the semiconductor substrate and located over the n-type drain layer, a recess formed in the p-type base layer so that the bottom end of the recess may be located lower than the p-type base layer, a gate insulation film formed over the inner wall of the recess, a gate electrode embedded into the recess, and an n-type source layer formed in the p-type base layer so as to be shallower than the p-type base layer and located next to the recess in a planar view, wherein the p-type base layer has, in an impurity profile in the thickness direction, a first peak, a second peak being located closer to the bottom face side of the semiconductor substrate than the first peak and being higher than the first peak, and a third peak located between the first peak and the second peak.

As a result of earnest studies by the present inventors, it has been found that one of the factors which narrow an SOA is the operation of a parasitic bipolar transistor comprising an n-type drain layer, a p-type base layer, and an n-type source layer. Specifically, electric current flows from an n-type drain layer to an n-type source layer through a p-type base layer while a vertical-type transistor operates. When there is a steep concentration gradient in the p-type base layer, the electric current causes a large potential gradient to be generated at the site of the steep concentration gradient. The potential gradient acts as the base voltage of a parasitic bipolar transistor and makes the bipolar transistor operate.

In the present invention in contrast, the impurity profile of a p-type base layer in the depth direction has a third peak between a first peak and a second peak. That makes it possible to inhibit a steep concentration gradient from being generated in the p-type base layer. Consequently, it is possible to inhibit a parasitic bipolar transistor comprising an n-type drain layer, a p-type base layer, and an n-type source layer from operating. As a result, an SOA in a vertical-type bipolar transistor can be inhibited from narrowing.

The present invention provides a method for manufacturing a semiconductor device, including the steps of forming a recess over the surface of an n-type semiconductor substrate, forming a gate insulation film over the inner wall and the bottom face of the recess, embedding a gate electrode into the recess, forming a p-type base layer in the surface layer of the semiconductor substrate so as to be shallower than the recess, and forming an n-type source layer in the p-type base layer so as to be shallower than the p-type base layer, wherein the impurity profile of the p-type base layer in the thickness direction has a first peak, a second peak being located closer to the bottom face side of the semiconductor substrate than the first peak and being higher than the first peak, and a third peak located between the first peak and the second peak by implanting impurity ions three times or more at ion implantation energies different from each other in the step of forming the p-type base layer.

The present invention provides an electronic device having a load driven by electric power supplied from an electric power source and a semiconductor device to control electric power supply from the electric power source to the load, wherein: the semiconductor device has a semiconductor substrate, an n-type drain layer formed in the semiconductor substrate and located on the bottom face side of the semiconductor substrate, a p-type base layer formed in the semiconductor substrate and located over the n-type drain layer, a recess formed in the p-type base layer so that the bottom end of the recess may be located lower than the p-type base layer, a gate insulation film formed over the inner wall of the recess, a gate electrode embedded into the recess, and an n-type source layer formed in the p-type base layer so as to be shallower than the p-type base layer and located next to the recess in a planar view; and the p-type base layer has, in an impurity profile in the thickness direction, a first peak, a second peak being located closer to the bottom face side of the semiconductor substrate than the first peak and being higher than the first peak, and a third peak located between the first peak and the second peak.

The present invention provides a vehicle having a battery, a lamp driven by electric power supplied from the battery, and a semiconductor device to control electric power supply from the battery to the lamp, wherein: the semiconductor device has a semiconductor substrate, an n-type drain layer formed in the semiconductor substrate and located on the bottom face side of the semiconductor substrate, a p-type base layer formed in the semiconductor substrate and located over the n-type drain layer, a recess formed in the p-type base layer so that the bottom end of the recess may be located lower than the p-type base layer, a gate insulation film formed over the inner wall of the recess, a gate electrode embedded into the recess, and an n-type source layer formed in the p-type base layer so as to be shallower than the p-type base layer and located next to the recess in a planar view; and the p-type base layer has, in an impurity profile in the thickness direction, a first peak, a second peak being located closer to the bottom face side of the semiconductor substrate than the first peak and being higher than the first peak, and a third peak located between the first peak and the second peak.

The present invention makes it possible to inhibit the SOA of a vertical-type bipolar transistor from narrowing.

DETAILED DESCRIPTION

Embodiments according to the present invention are hereunder explained in reference to drawings. Here, in all the drawings, an identical component is represented by an identical code and the explanations are omitted appropriately.

First Embodiment

Figure 1:
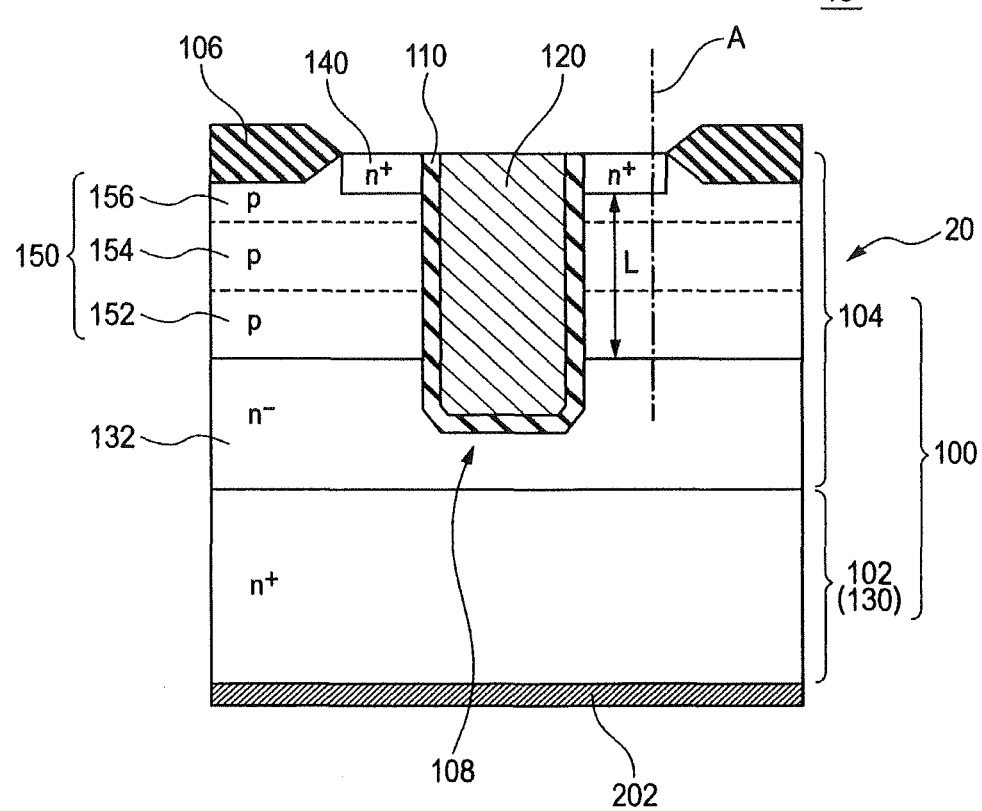
FIG. 1 is a sectional view showing the configuration of a semiconductor device according to First Embodiment.

FIG. 1 is a sectional view showing the configuration of a semiconductor device 10 according to First Embodiment. The semiconductor device 10 has a vertical-type MOS transistor 20. The vertical-type MOS transistor 20: is formed by using a semiconductor substrate 100; and has an n-type drain layer 130, a p-type base layer 150, a gate insulation film 110, a gate electrode 120, and an n-type source layer 140. The n-type drain layer 130 is formed in the semiconductor substrate 100 and is located on the bottom face side of the semiconductor substrate 100. The p-type base layer 150 is formed in the semiconductor substrate 100 and is located above the n-type drain layer 130. Further, a recess 108 is formed in the semiconductor substrate 100. The recess 108 is formed in the p-type base layer 150 and the bottom end thereof is located lower than the p-type base layer 150. The gate insulation film 110 is formed over the inner wall and the bottom face of the recess 108. The gate electrode 120 is embedded into the recess 108. The n-type source layer 140 is formed in the p-type base layer 150 so as to be shallower than the p-type base layer 150. The n-type source layer 140 is located next to the recess 108 in a planar view.

The p-type base layer 150 has, in the impurity profile in the thickness direction, a first peak, a second peak, and a third peak. The first peak is located on the topmost surface side of the semiconductor substrate 100. The second peak is located closer to the bottom face side of the semiconductor substrate 100 than the first peak and is higher than the first peak. The third peak is located between the first peak and the second peak. A detailed description is given hereunder.

The semiconductor substrate 100 is configured by forming an epitaxial layer 104 over a semiconductor substrate 102. The semiconductor substrate 102 is an $n^+$-type silicon substrate for example and the epitaxial layer 104 is an $n^-$-type silicon layer for example. The semiconductor substrate 102 functions as the n-type drain layer 130. A drain electrode 202 is formed over the bottom face of the semiconductor substrate 102. The p-type base layer 150 is formed by implanting p-type impurities into the epitaxial layer 104. Then a layer, in which a p-type base layer 150 is not formed, in the epitaxial layer 104 is located between the n-type drain layer 130 and the p-type base layer 150 as an $n^-$-type layer 132.

The p-type base layer 150 is formed in the surface layer of the epitaxial layer 104. The p-type base layer 150 has a first region 156, a third region 154, and a second region 152 in this order from the top face side of the epitaxial layer 104. When an impurity concentration profile in the thickness direction is viewed, the first region 156 has a first peak, the third region 154 has a third peak, and the second region 152 has a second peak.

A distance L from the bottom end of the p-type base layer 150 to the bottom end of the n-type source layer 140 is 1.4.mu.m or longer. In a vertical-type transistor, an electric current $I_{ds}$ flowing from a drain to a source is represented by the following expression.

$$I_{ds} = \mu \cdot C_g \cdot W (V_{ds} - V_{th})^2 / (2 \cdot l) \quad (1)$$

Here, $\mu$: mobility, $C_g$: gate capacitance, W: channel width, $l$: channel length, $V_{ds}$: voltage between drain and source, and $V_{th}$: threshold voltage.

Figure 18:
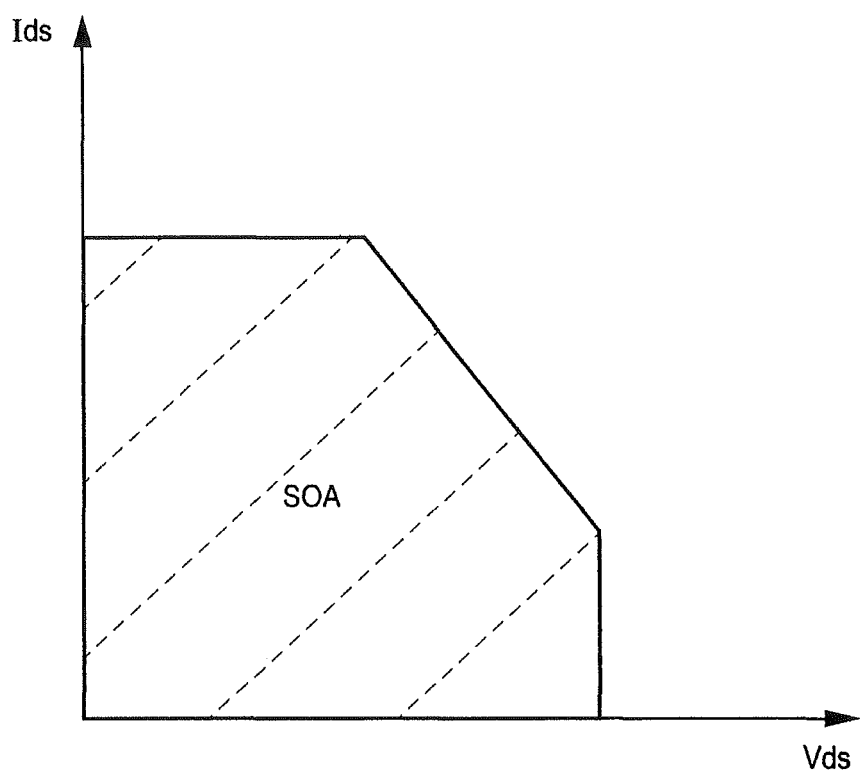
FIG. 18 is a graph explaining an SOA (Safe Operating Area).

From the expression (1), it is obvious that the dependency of on $V_{ds}$ lowers by increasing the channel length $l$. That means that the inclination of the oblique part in the upper right of the SOA shown in FIG. 18 comes to be gradual. Consequently, an SOA broadens by lengthening a channel length l, namely by lengthening a distance L from the bottom end of the p-type base layer 150 to the bottom end of the n-type source layer 140.

Meanwhile, the increase of a distance L leads to the increase of resistance between a source and a drain and hence deviates from an ordinary design concept of a vertical-type MOS transistor. When a semiconductor device having a vertical-type MOS transistor 20 is used for an application that regards a broad SOA as important (in-vehicle application for example) however, it is effective to increase the distance L to a certain length (1.4.mu.m or longer for example). Even in this case however, it is preferable that the distance L is not longer than 2.5.mu.m in order to control resistance between a source and a drain.

An element isolation film 106 is formed over the surface of the epitaxial layer 104. The element isolation film 106 is formed by a LOCOS method for example. In a planar view, the recess 108 and the n-type source layer 140 are foil led inside the element isolation film 106. The recess 108 is formed into a trench shape and the n-type source layer 140 is located on both the sides of the trench. Here, the bottom end of the recess 108 is located in the n.sup.--layer 132 but does not reach the n-type drain layer 130.

Figure 2:
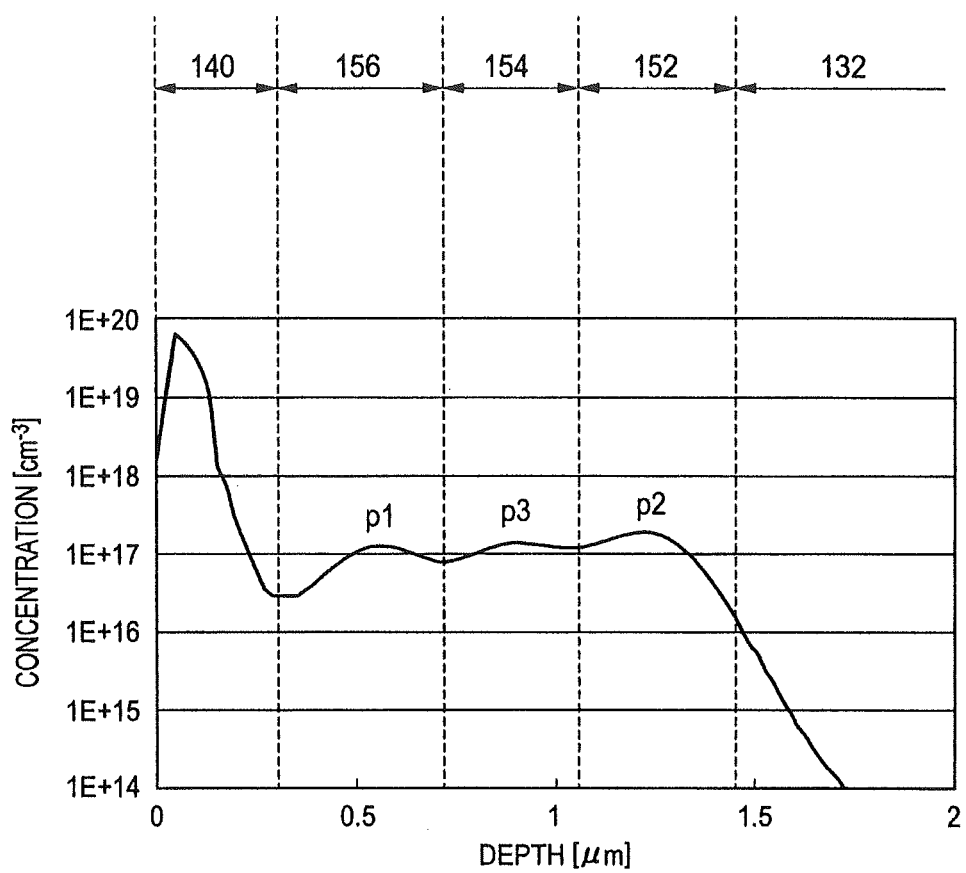
FIG. 2 is a graph showing a concentration profile of impurities in the depth direction taken on line A in FIG. 1.

FIG. 2 shows an impurity concentration profile in the depth direction taken on line A in FIG. 1. As stated above, a p-type base layer 150 is formed by implanting p-type impurities (e.g. boron) into an n.sup.--type epitaxial layer 104. Then an n-type source layer 140 is formed by implanting n-type impurities (e.g. phosphorus) into the p-type base layer 150.

The impurity concentration of the n-type source layer 140 is higher than the impurity concentration of the p-type base layer 150. Then in the p-type base layer 150, a first peak p1 is formed in a first region 156, a second peak p3 is formed in a third region 154, and a second peak p2 is formed in a second region 152.

One of the factors to cause an SOA to narrow is the operation of a parasitic bipolar transistor including an n-type drain layer 130, a p-type base layer 150, and an n-type source layer 140. While a vertical-type MOS transistor 20 operates, an electric current $I_{ds}$ flows from the n-type drain layer 130 to the n-type source layer 140 through the p-type base layer 150. When there is a steep concentration gradient in the p-type base layer 150, the electric current $I_{ds}$ causes a large potential gradient to be generated at the part of the steep concentration gradient. The potential gradient works as a base voltage of a parasitic bipolar transistor and the parasitic bipolar transistor operates.

On the other hand, in the present embodiment, the concentration profile of a p-type base layer 150 in the depth direction has a third peak p3 between a first peak p1 and a second peak p2. Consequently, a parasitic bipolar transistor including an n-type drain layer 130, a p-type base layer 150, and an n-type source layer 140 hardly operates in comparison with the case where the third peak p3 is not provided. Further, a high-resistance part reduces in the p-type base layer 150 by providing the third peak p3. As a result, the on resistance of a vertical-type MOS transistor 20 lowers.

In the present embodiment further, the height of the second peak p2 is not more than three times the height of the first peak p1. If the height of the second peak p2 is higher than that, undesirably the above-stated parasitic bipolar transistor operates easily.

In the present embodiment furthermore, the distance from the bottom end of the p-type base layer 150 to the second peak p2 is not more than one third the thickness of the p-type base layer 150. That is, the second peak p2 is close to the bottom end of the p-type base layer 150. By so doing, it is possible to inhibit a depleted layer from extending from the n-type drain layer 130 toward the inside of the p-type base layer 150 when a high voltage is added to the n-type drain layer 130. Consequently, the vertical-type MOS transistor 20 can be inhibited from breaking when an extraordinarily high voltage is added to the n-type drain layer 130.

In the present embodiment further, the first peak p1 is lowest and the second peak p2 is highest. One of the factors to determine the threshold voltage of the vertical-type MOS transistor 20 is the peak height of the impurity concentration of the p-type base layer 150. If the peak height varies, the threshold voltage of the vertical-type MOS transistor 20 also varies undesirably. Since the first peak p1 is closest to the n-type source layer 140, the height of the first peak p1 also varies undesirably because of the variation of ion-implantation at the time of forming the n-type source layer 140. Consequently, if the first peak p1 is highest, the threshold voltage of the vertical-type MOS transistor 20 also varies undesirably. On the other hand, if the second peak p2 located in the lowest layer is highest like the present embodiment, it is possible to inhibit the threshold voltage of the vertical-type MOS transistor 20 from varying because of the variation of ion-implantation at the time of forming the n-type source layer 140.

Further, the height of the third peak p3 is between the heights of the first peak p1 and the second peak p2. By so doing, the gradient of the impurity concentration between the third peak p3 and the first peak p1 comes to be more gradual in comparison with the case where the third peak p3 is lower than the first peak p1. On this occasion, the parasitic bipolar transistor including the n-type drain layer 130, the p-type base layer 150, and the n-type source layer 140 operates more hardly.

Figure 3:
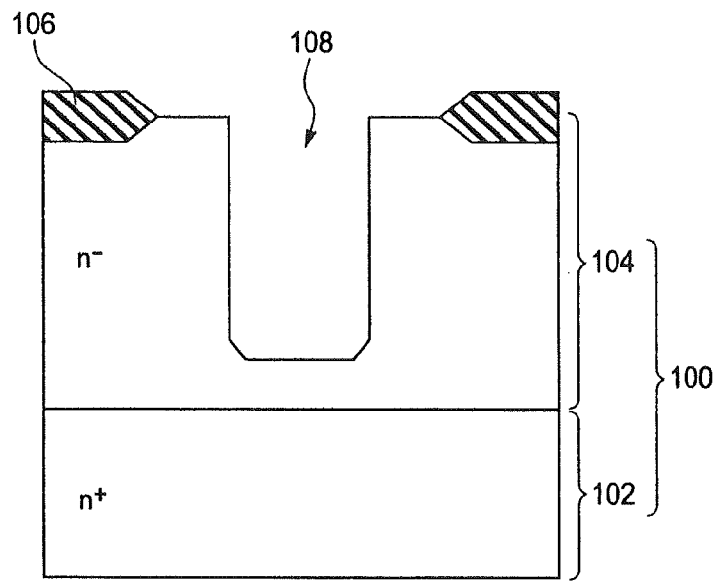
FIG. 3 is a sectional view showing a manufacturing method of the semiconductor device shown in the FIG. 1.
Figure 4:
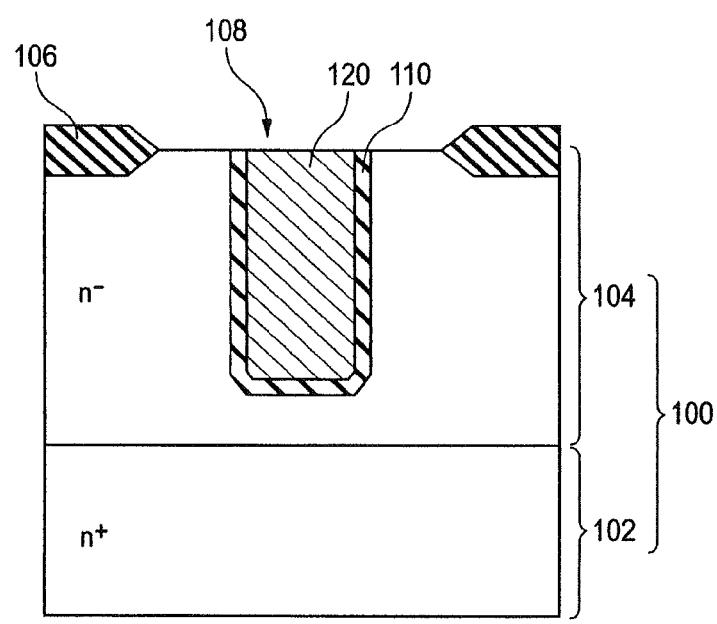
FIG. 4 is a sectional view showing a manufacturing method of the semiconductor device shown in the FIG. 1.
Figures 5, 6:
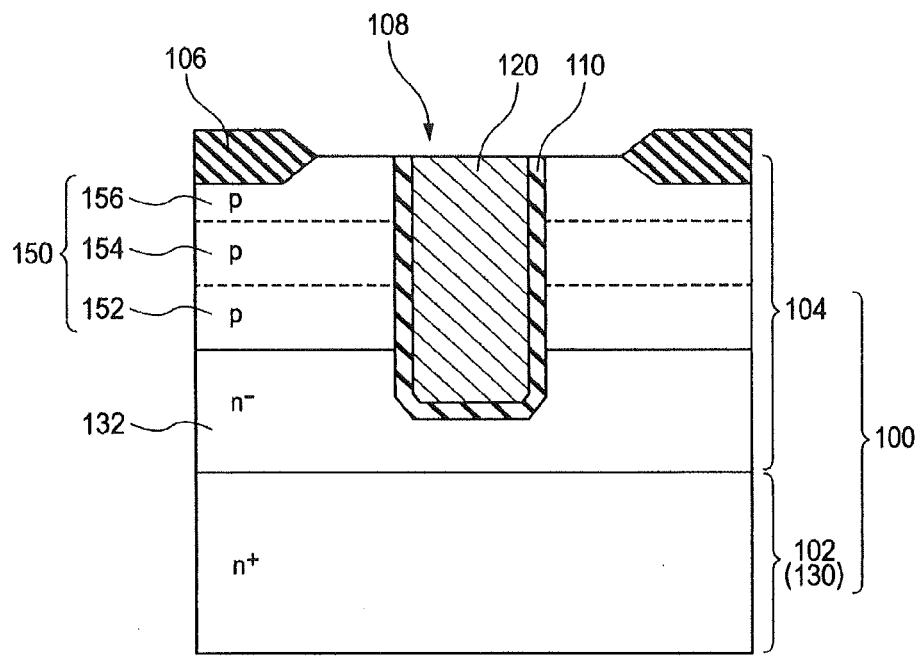
FIG. 5 is a sectional view showing a manufacturing method of the semiconductor device shown in the FIG. 1.
FIG. 6 is a table showing a dump surge capacity of the vertical-type MOS transistor shown in FIG. 1 together with comparative examples.

FIGS. 3 to 5 are sectional views showing a manufacturing method of the semiconductor device shown in FIG. 1. Firstly as shown in FIG. 3, an n.sup.+-type semiconductor substrate 102 is prepared. Successively, an n.sup.--type epitaxial layer 104 is formed over the semiconductor substrate 102. Successively, an element isolation film 106 is formed in the surface layer of the epitaxial layer 104. Successively, a recess 108 is formed in a semiconductor substrate 100.

Successively as shown in FIG. 4, the semiconductor substrate 100 is thermally oxidized. By so doing, a gate insulation film 110 is formed over the inner wall and the bottom face of the recess 108. Here, a thermally oxidized film is formed also over the surface of the semiconductor substrate 100 in a region not covered with the element isolation film 106. Successively, a polysilicon film is formed in the recess 108 and over the semiconductor substrate 100 by a CVD method for example. Successively, the polysilicon film located over the semiconductor substrate 100 is removed by etch back for example. In this way, a gate electrode 120 is embedded into the recess 108.

Successively as shown in FIG. 5, p-type impurities are ion-implanted into the epitaxial layer 104 of the semiconductor substrate 100. By so doing, a p-type base layer 150 is formed so as to be shallower than the recess 108. Specifically, the ion-implantation is applied three times at energies different from each other. By so doing, the p-type base layer 150 is formed as a structure formed by stacking a second region 152, a third region 154, and a first region 156. Here, it is preferable that the second region 152, the third region 154, and the first region 156 are formed in this order. Here, thermal treatment to activate ions for forming the p-type base layer 150 is applied at a temperature between 800.degree. C. and 900.degree. C. for example.

Successively, n-type impurities are ion-implanted into the p-type base layer 150. By so doing, an n-type source layer 140 is formed. Further, a drain electrode 202 is formed. In this way, the semiconductor device shown in FIG. 1 is formed.

FIG. 6 is a table showing a dump surge capacity (namely, tolerance to an extraordinarily high voltage) of a vertical-type MOS transistor 20 (Example) shown in FIG. 1 as well as Comparative Examples. With regard to the specimens shown in the table, in the case of Example, the ion-implantation energy for forming a first peak p1 in the p-type base layer 150 is 200 keV. Then the ion-implantation energy for forming a second peak p2 in the p-type base layer 150 is 600 keV. Then the ion-implantation energy for forming a third peak p3 in the p-type base layer 150 is 400 keV. Then the magnitude relation of the first peak p1, the second peak p2, and the third peak p3 is adjusted as shown in FIG. 2.

Meanwhile, as Comparative Examples, a specimen not having a third peak p3 (Comparative Example 1) and another specimen not having a first peak p1 (Comparative Example 2) are prepared.

In all the plural samples of the specimen according to Example, a vertical-type MOS transistor 20 is not broken even when a voltage of 60 V is applied to a drain electrode 202. Here, a voltage of 60V or more cannot be applied to a drain electrode 202 because of the test apparatus.

On the contrary, in all the samples of the specimen according to Comparative Example 1, a vertical-type MOS transistor 20 is broken when a certain level of voltage, more than 60 V, is applied to a drain electrode 202. Specifically, the average voltage at the breakage is 57 V.

In all the samples of the specimen according to Comparative Example 2, a vertical-type MOS transistor 20 is also broken when a certain level of voltage, 50 V or less, is applied to a drain electrode 202. Specifically, the average voltage at the breakage is 46 V.

From those results, it is obvious that, in the vertical-type MOS transistor 20 shown in FIG. 1, tolerance to an extraordinary voltage increases because an SOA broadens.

When the hfe (current amplification factor) of the vertical-type MOS transistor 20 in Example 1 is set at 1, the hfe is 1.09 in Comparative Example 1 and 1.22 in Comparative Example 2. It can be said that, when a vertical-type MOS transistor 20 is required to have a tolerance of 50 V or more to extraordinary voltage for example, a preferable hfe of the vertical-type MOS transistor 20 is 1.1 times or less of that in Example 1.

As stated above, in the present embodiment, it is possible to broaden an SOA of a vertical-type MOS transistor 20 in a semiconductor device having the vertical-type MOS transistor 20.

Second Embodiment

Figure 7:
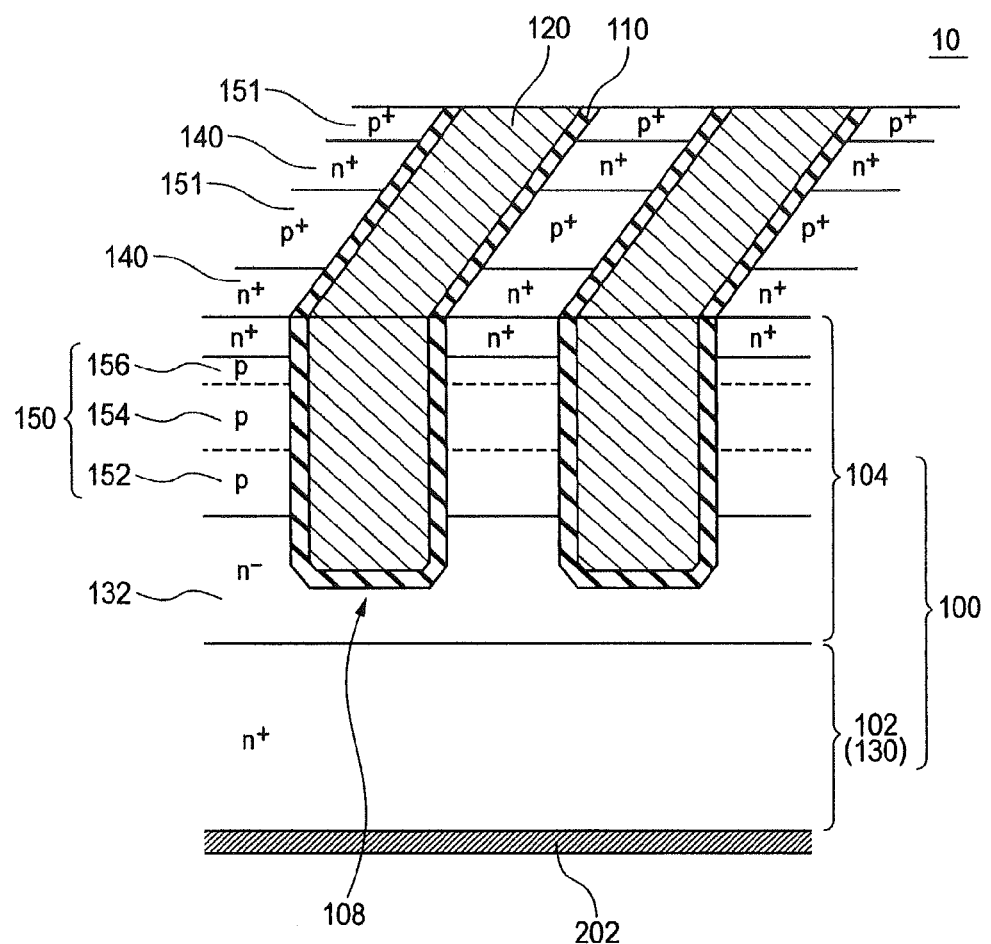
FIG. 7 is a perspective sectional view showing the configuration of a semiconductor device according to Second Embodiment.
Figure 8:
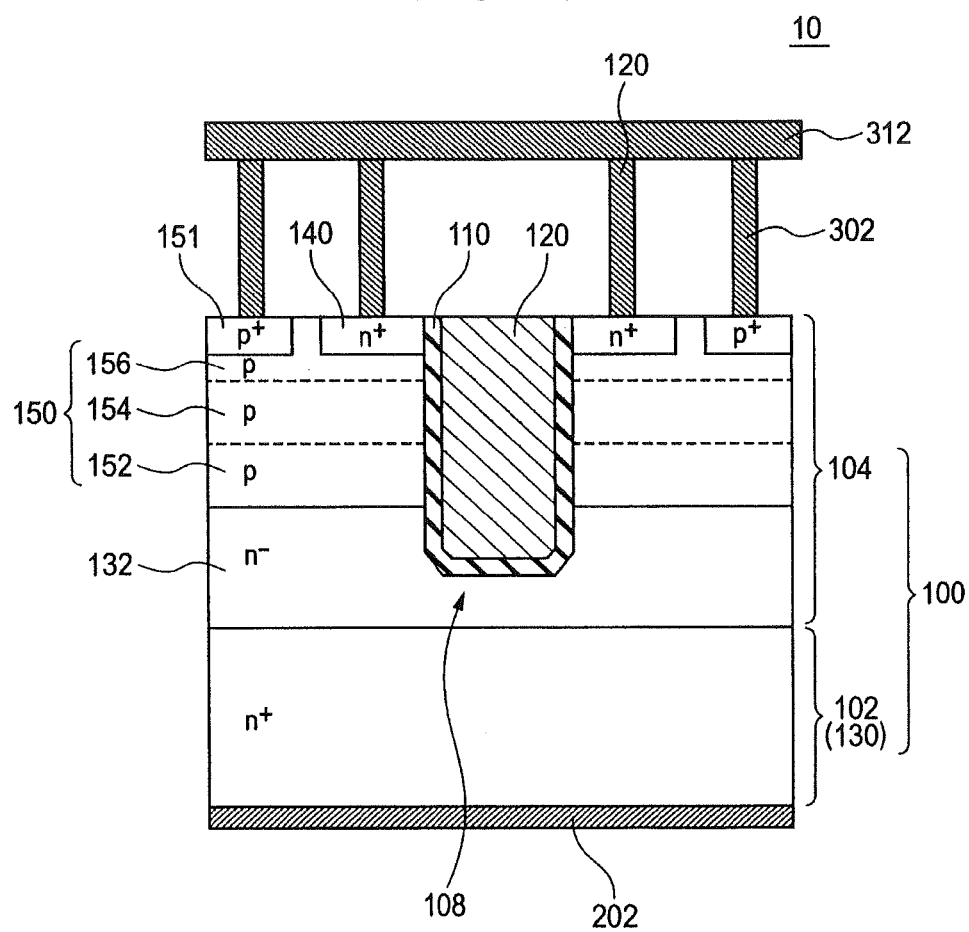
FIG. 8 is a view explaining the coupling structure of wires in the semiconductor device shown in FIG. 7.

FIG. 7 is a perspective sectional view showing the configuration of a semiconductor device according to Second Embodiment. FIG. 8 is a view explaining the coupling structure of wires in the semiconductor device shown in FIG. 7. The semiconductor device has a similar configuration to a semiconductor device according to First Embodiment except that it has a p-type layer 151.

The p-type layer 151 is provided in order to give a reference voltage to a p-type base layer 150 and the bottom end thereof is coupled to the p-type base layer 150. Specifically, the p-type layer 151 is formed in the region of the surface layer of the p-type base layer 150 where an n-type source layer 140 is not formed. The impurity concentration of the p-type layer 151 is higher than the impurity concentration of the p-type base layer 150. The p-type layer 151 is coupled to a first source wire 312 through a contact 302 as shown in FIG. 8. That is, the first source wire 312 applies a reference voltage to the p-type base layer 150 through the contact 302 and the p-type layer 151. Here, the first source wire 312 is coupled also to the n-type source layer 140 through a contact 301. The contact 301 is a tungsten plug and the first source wire 312 is an Al wire. The first source wire 312 however may be a Cu wire having a damascene structure.

As shown in FIG. 7, a gate electrode 120 is embedded into a groove-like recess 108. Then the n-type source layer 140 and the p-type layer 151 are formed alternately along the extending direction of the gate electrode 120.

Figure 16:
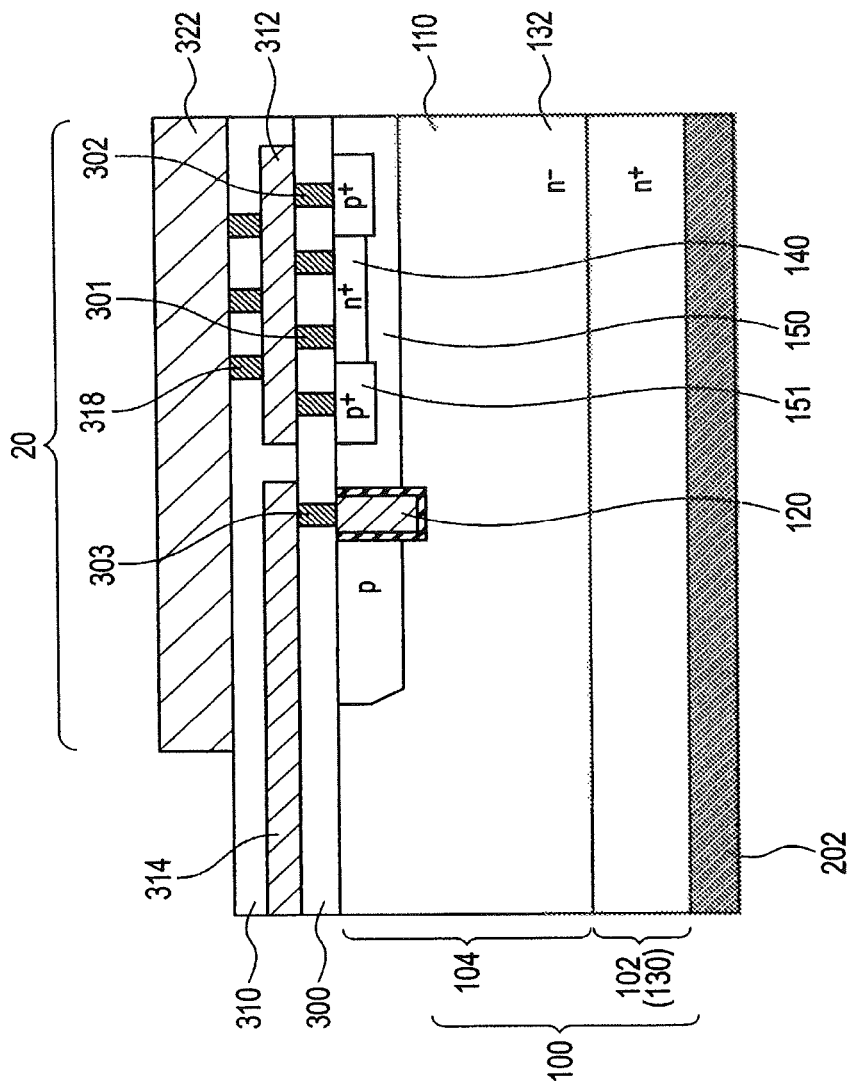
FIG. 16 is a sectional view showing a first example of the wiring structure of the semiconductor device shown in FIG. 7.

FIG. 16 is a view showing a first example of the configuration of a wiring layer in a semiconductor device 10. An interlayer insulation film 300 is formed over a semiconductor substrate 100. The interlayer insulation film 300 is an insulation film containing $SiO_2$ as a major component such as BPSG for example. A first source wire 312 and a wire 314 are formed over the interlayer insulation film 300. The first source wire 312 and the wire 314 are metal wires and Al wires for example.

In the interlayer insulation film 300, a contact 301, a contact 302, and a contact 303 are embedded. In a vertical-type MOS transistor, the contact 301 couples an n-type source layer 140 to the first source wire 312. The contact 302 couples a p-type layer 151 to the first source wire 312. The contact 303 couples a gate electrode 120 to the wire 314. That is, signals are inputted into the gate electrode 120 through the wire 314. The contacts 301, 302, and 303 are formed at a different step from the first source wire 312.

An interlayer insulation film 310 is formed on the interlayer insulation film 300, the first source wire 312, and the wire 314. The interlayer insulation film 310 is an insulation film containing $SiO_2$ as a major component such as BPSG for example. A second source wire 322 is formed over the interlayer insulation film 310. The film thickness of the second source wire 322 is thicker than the film thicknesses of the first source wire 312 and the wire 314.

The second source wire 322 overlaps with a vertical-type MOS transistor 20 in a planar view. Further, a via 318 is embedded in the interlayer insulation film 310. The second source wire 322 is coupled to the first source wire 312 through the via 318. The via 318 includes W for example.

Figure 17:
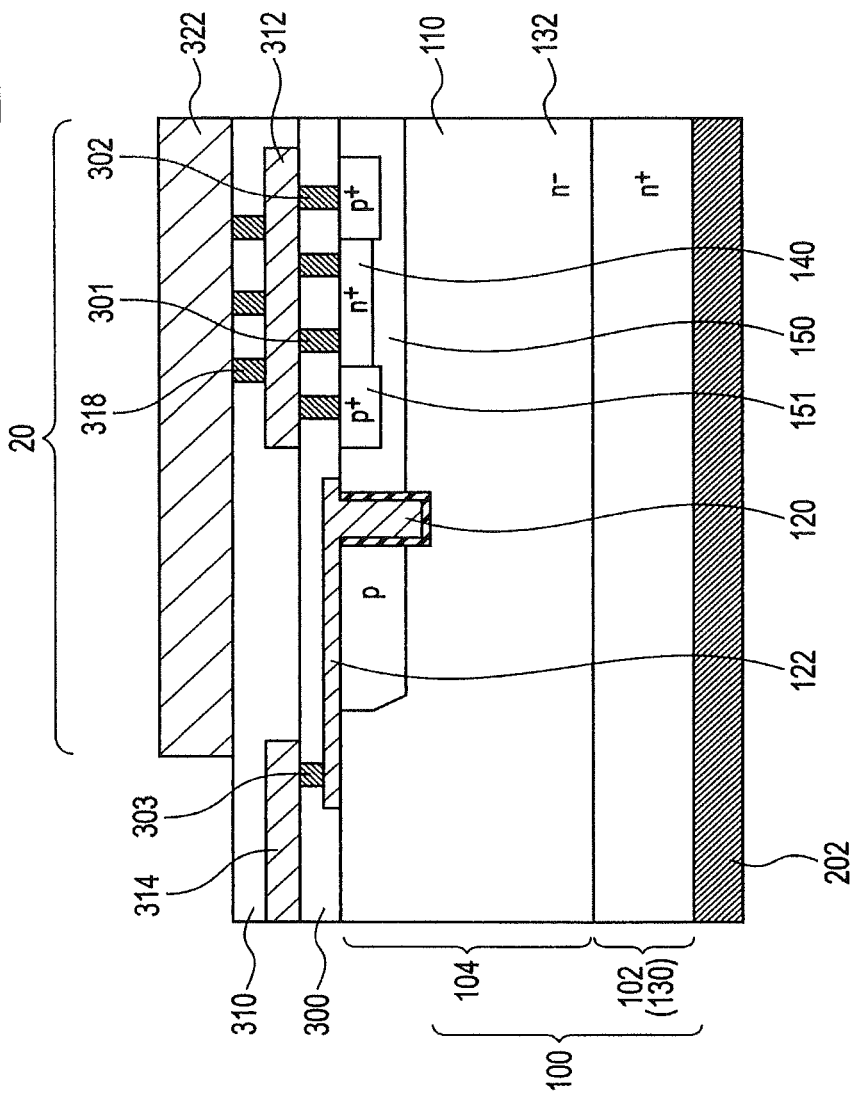
FIG. 17 is a sectional view showing a second example of the wiring structure of the semiconductor device shown in FIG. 7.

FIG. 17 is a view showing a second example of the configuration of a wiring layer in a semiconductor device 10. The example shown in the figure has the same configuration as that shown in FIG. 16 except the following points.

Firstly, a polysilicon wire 122 is coupled to a gate electrode 120. The polysilicon wire 122 is formed over a semiconductor substrate 100 at a step identical to the gate electrode 120. The polysilicon wire 122 extends outside a vertical-type MOS transistor 20 in a planar view. Then the polysilicon wire 122 is coupled to a wire 314 through a contact 303 at the exterior of the vertical-type MOS transistor 20.

In the present embodiment, effects similar to First Embodiment can be obtained.

Third Embodiment

The configuration and the manufacturing method of a semiconductor device according to Third Embodiment are nearly the same as those according to First Embodiment. However, n-type impurity ions such as phosphorus ions are implanted into a surface layer in a region to act as an n.sup.-- type layer 132 before a p-type base layer 150 is formed. An ion-implantation energy on this occasion is larger than an ion-implantation energy required when the p-type base layer 150 is formed. By so doing, the thickness of the n.sup.−-type layer 132 increases toward the surface side of a semiconductor substrate 100. When the thickness of the n.sup.−-type layer 132 increases, even if a depletion layer extends from an n-type drain layer 130 toward the p-type base layer 150, the possibility that the depletion layer enters the p-type base layer 150 lowers. By so doing, the possibility of breaking a vertical-type MOS transistor 20 further lowers even though a high voltage is applied to a drain electrode 202.

Figure 9:
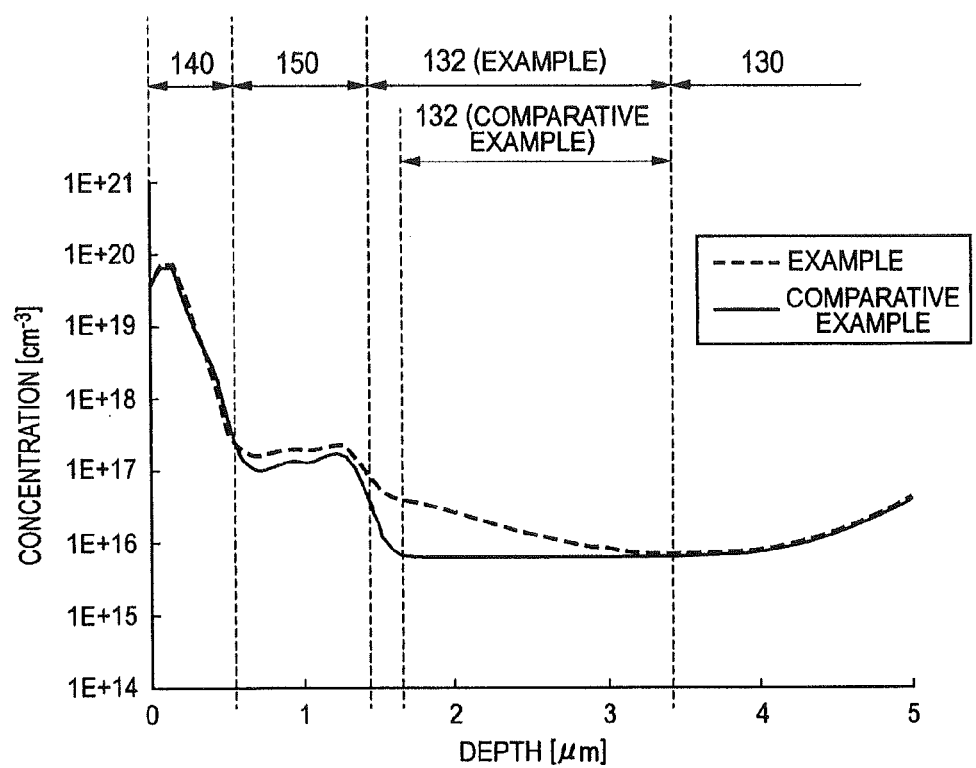
FIG. 9 is a graph showing an impurity profile of a semiconductor device according to Third Embodiment together with a comparative example.

FIG. 9 shows a simulation result of an impurity concentration profile when the ion-implantation energies used for forming a first peak p1, a second peak p2, and a third peak p3 in the p-type base layer 150 are set at 200 keV, 600 keV, and 400 keV respectively and the above-stated n-type impurity ions are implanted at 800 keV. Here, as a comparative example, a simulation result of an impurity concentration profile when the n-type impurity ions at 800 keV are not implanted is shown. From the simulation results, it is also obvious that the thickness of an n.sup.−-type layer 132 increases when n-type impurity ions are implanted at an energy larger than an energy for forming the p-type base layer 150.

Fourth Embodiment

Figure 10:
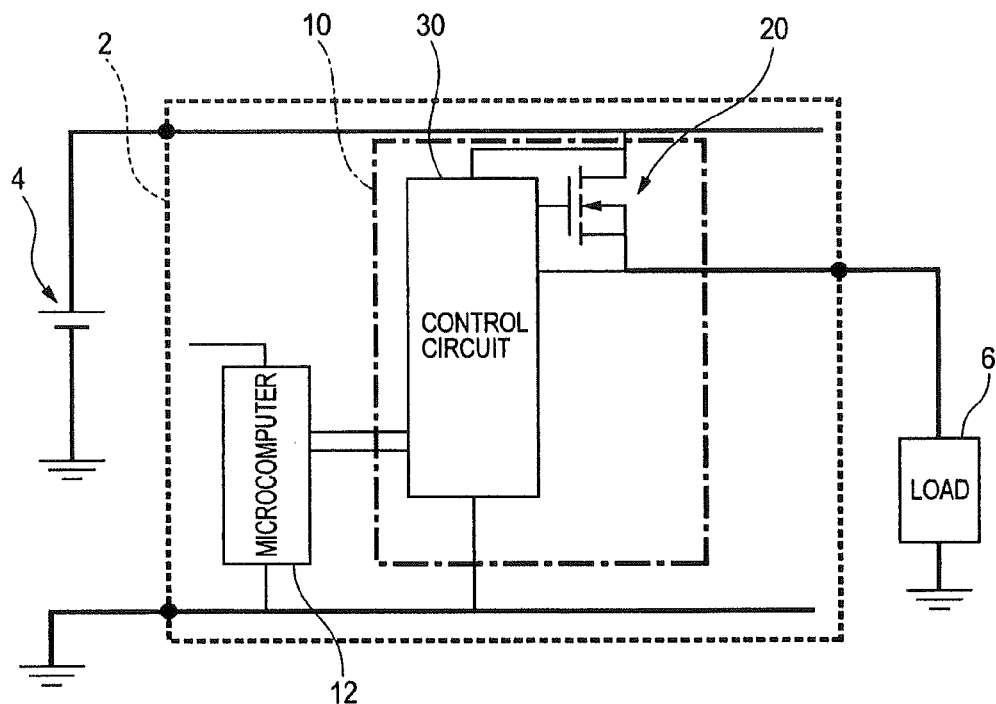
FIG. 10 is a diagram showing a circuit configuration of an electronic device according to Fourth Embodiment.

FIG. 10 is a diagram showing a circuit configuration of an electronic device according to Fourth Embodiment. The electronic device is used in a vehicle for example and has an electronic device 2, an electric power source 4, and a load 6. The electric power source 4 is a battery mounted on a vehicle for example. The load 6 is an electronic component such as a headlamp mounted on a vehicle for example. Then the electronic device 2 controls electric power supplied from the electric power source 4 to the load 6.

The electronic device 2 is configured by mounting semiconductor devices 10 and 12 over a circuit board (for example, a printed wiring board). The semiconductor device 10 is an IPD (Intelligent Power Device) and is configured by forming a vertical-type MOS transistor 20 and a control circuit (logic circuit) 30 over an identical semiconductor substrate. The semiconductor device 12 is a microcomputer and is coupled to the semiconductor device 10 through the wiring of the circuit board. The semiconductor device 12 controls the semiconductor device 10. Specifically, the semiconductor device 12 inputs control signals into the control circuit 30. Then, the control circuit 30 inputs signals to a gate electrode 120 of the vertical-type MOS transistor 20 in accordance with the control signals inputted by the semiconductor device 12. That is, the control circuit 30 controls the vertical-type MOS transistor 20. Electric power from the electric power source 4 is supplied to the load 6 appropriately by controlling the vertical-type MOS transistor 20.

Figure 11A:
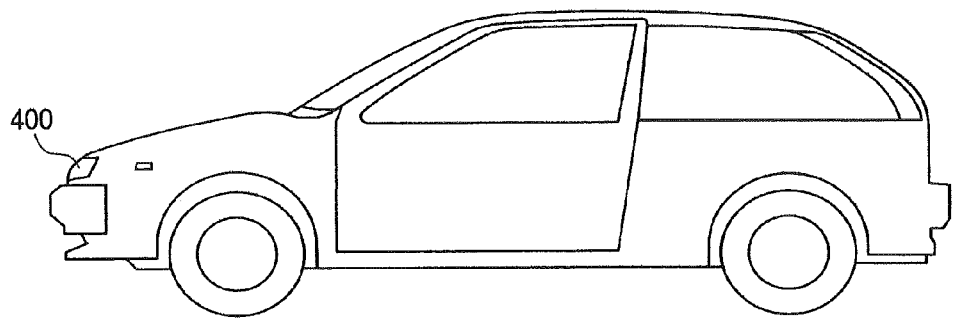
FIGS. 11A and 11B are views showing vehicles each of which includes an electronic device shown in FIG. 10.
Figure 11B:
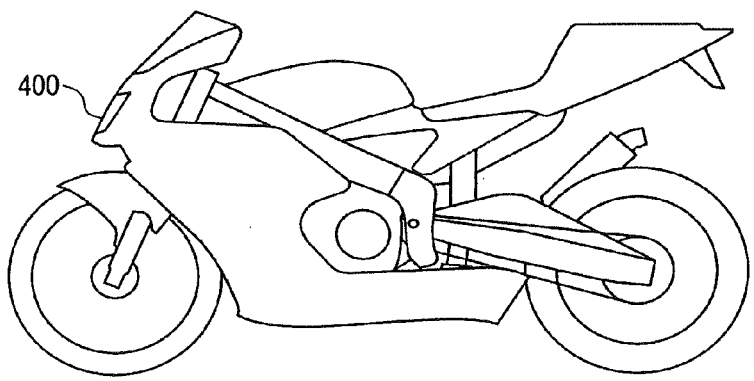

FIGS. 11A and 11B are views showing the configurations of vehicles each of which has an electronic device 2 shown in FIG. 10. A vehicle can be an automobile as shown in FIG. 11A or a motorbike as shown in FIG. 11B for example. Either of the vehicles has a battery as an electric power source 4, an electronic device 2, and a headlamp 400 as a load 6. It sometimes happens that the headlamp 400 goes out while in use. A high voltage is likely to be applied to a vertical-type MOS transistor 20 at a moment when the headlamp 400 goes out. In a vertical-type MOS transistor 20 according to the present embodiment, a parasitic bipolar transistor hardly operates as stated above. Consequently, the vertical-type MOS transistor 20 is hardly broken even when a high voltage is applied to the vertical-type MOS transistor 20 at a moment when the headlamp 400 goes out.

Figure 12:
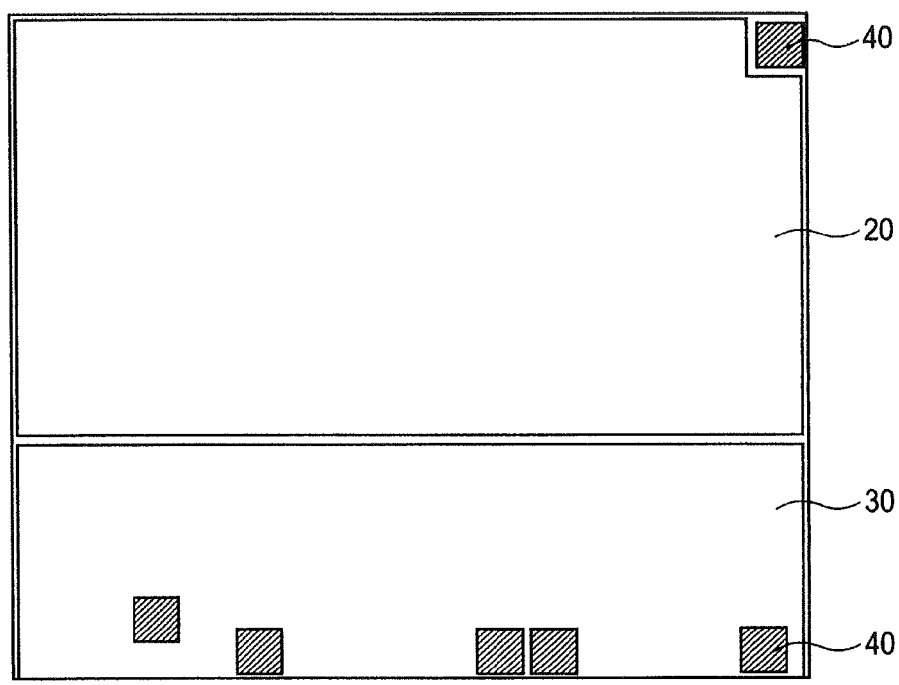
FIG. 12 is a planar view of the semiconductor device shown in FIG. 10.

FIG. 12 is a plan view of the semiconductor device 10 shown in FIG. 10. As shown in the figure, the semiconductor device 10 has a region where a vertical-type MOS transistor 20 is formed and a region where a control circuit 30 is formed. Then a plurality of electrode pads 40 coupled to the control circuit 30 are formed over the surface of the semiconductor device 10. Here, at least one of the electrode pads 40 may be formed on the other side of the region where the control circuit 30 is formed through the region where the vertical-type MOS transistor 20 is formed.

Figure 13:
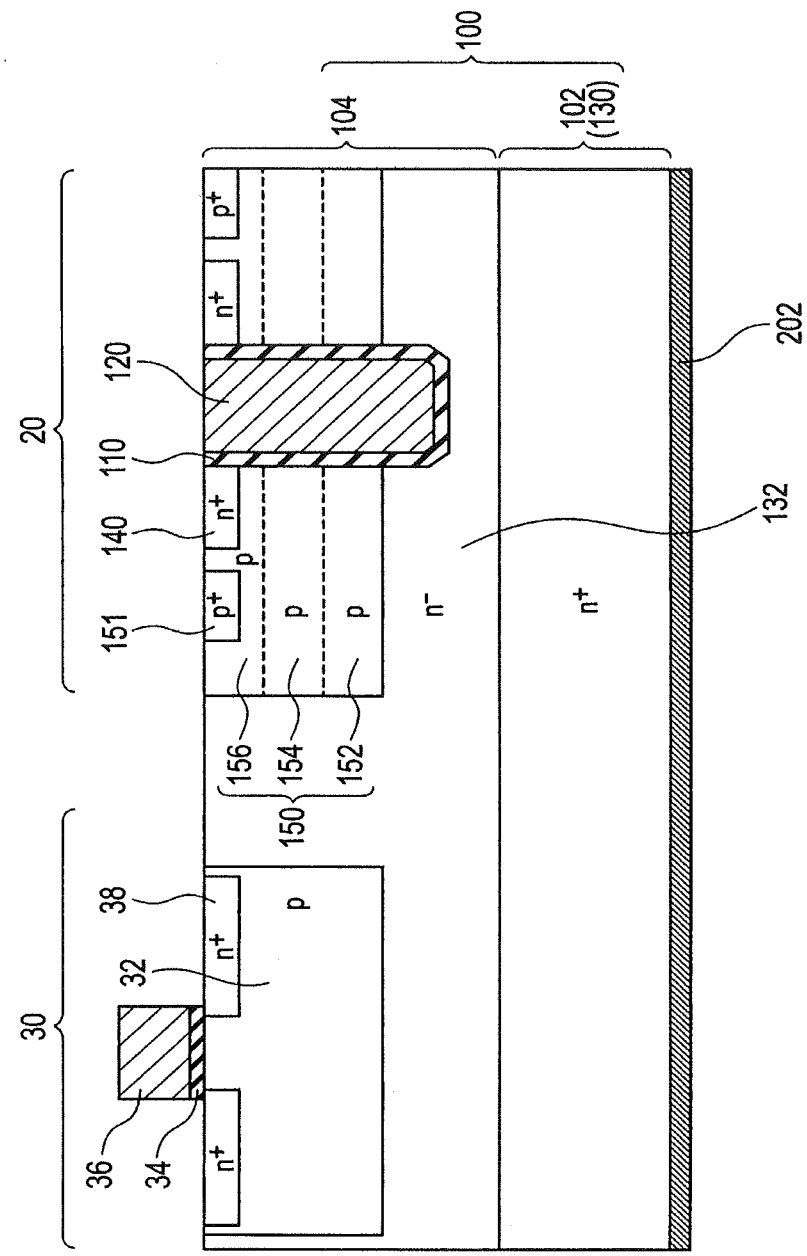
FIG. 13 is a sectional view showing the configuration of the semiconductor device shown in FIG. 10.

FIG. 13 is a sectional view showing the configuration of the semiconductor device 10 shown in FIG. 10. As stated above, the semiconductor device 10 is configured by forming a vertical-type MOS transistor 20 and a control circuit 30 over a semiconductor substrate 100. The control circuit 30 has a planer-type MOS transistor 31. The MOS transistor 31, when it is an n-type, is formed in a p-type channel region 32 formed in an epitaxial layer 104 and has a gate insulation film 34, a gate electrode 36, and an impurity region 38 to act as a source and a drain. When the MOS transistor 31 is a p-type in contrast, an n-type epitaxial layer 104 may be used as a well as it is. Then the impurity region 38 may have an extension region. On this occasion, a sidewall is formed over the sidewall of the gate electrode 36.

In the present embodiment, if a load 6 is broken for example, an extraordinary voltage may possibly be applied to a vertical-type MOS transistor 20 in a semiconductor device 10 at a moment when the load 6 is broken. Even in such a case, the possibility that the vertical-type MOS transistor 20 according to the present embodiment is broken is low since an SOA is broad. In the case where the load 6 is a headlamp particularly, it likely happens that the headlamp goes out. Consequently, it is very effective to adopt the technology according to the present embodiment in a semiconductor device 10 to be mounted on a vehicle.

Fifth Embodiment

Figure 14:
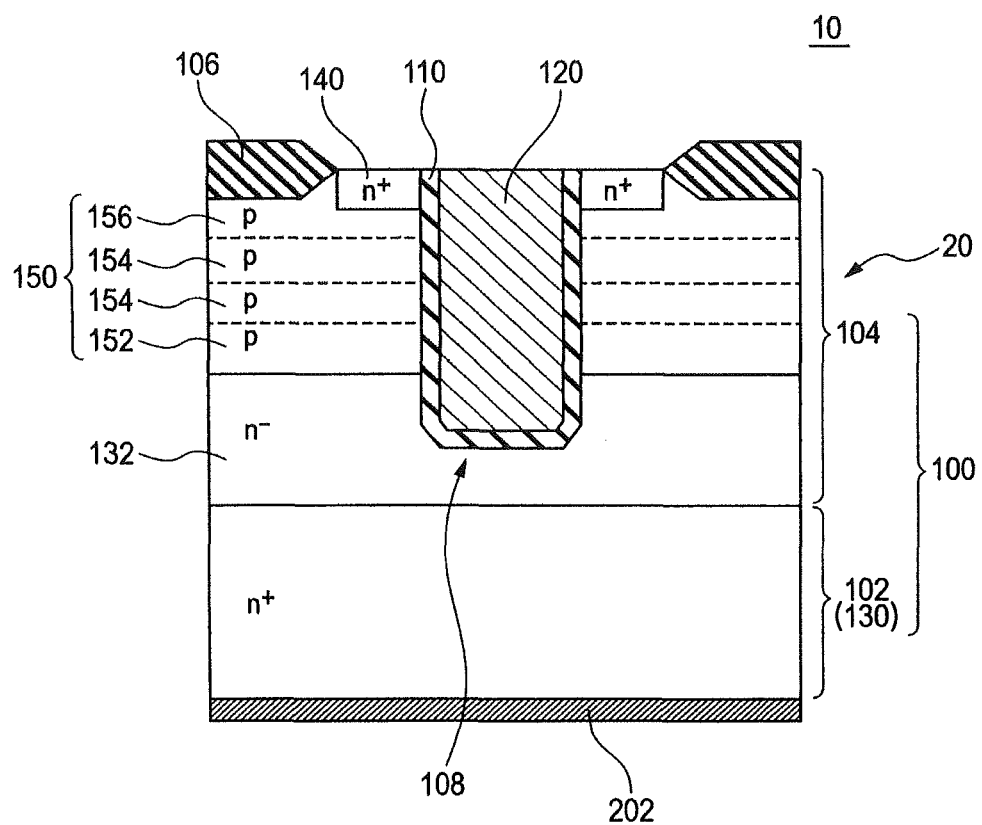
FIG. 14 is a sectional view showing the configuration of a semiconductor device according to Fifth Embodiment.

FIG. 14 is a sectional view showing the configuration of a semiconductor device 10 according to Fifth Embodiment. The semiconductor device 10 according to the present embodiment is similar to that according to any one of First to Fourth Embodiments except that a p-type base layer 150 has a plurality of third regions 154. Each of the third regions 154 has a third peak p3 in an impurity concentration profile in the thickness direction. It is preferable that each of the third peaks p3 comes to be higher as it comes close to a second region 152. Here, although the p-type base layer 150 has two third regions 154 in FIG. 14, it is also possible to have three or more third regions 154.

In the present embodiment, effects similar to First to Fourth Embodiments can be obtained. Further, since a p-type base layer 150 has a plurality of third regions 154, a part in the p-type base layer 150 where an impurity concentration rapidly changes reduces further when viewed in the thickness direction. Consequently, a parasitic bipolar transistor including an n-type drain layer 130, a p-type base layer 150, and an n-type source layer 140 operates more hardly.

Sixth Embodiment

Figure 15:
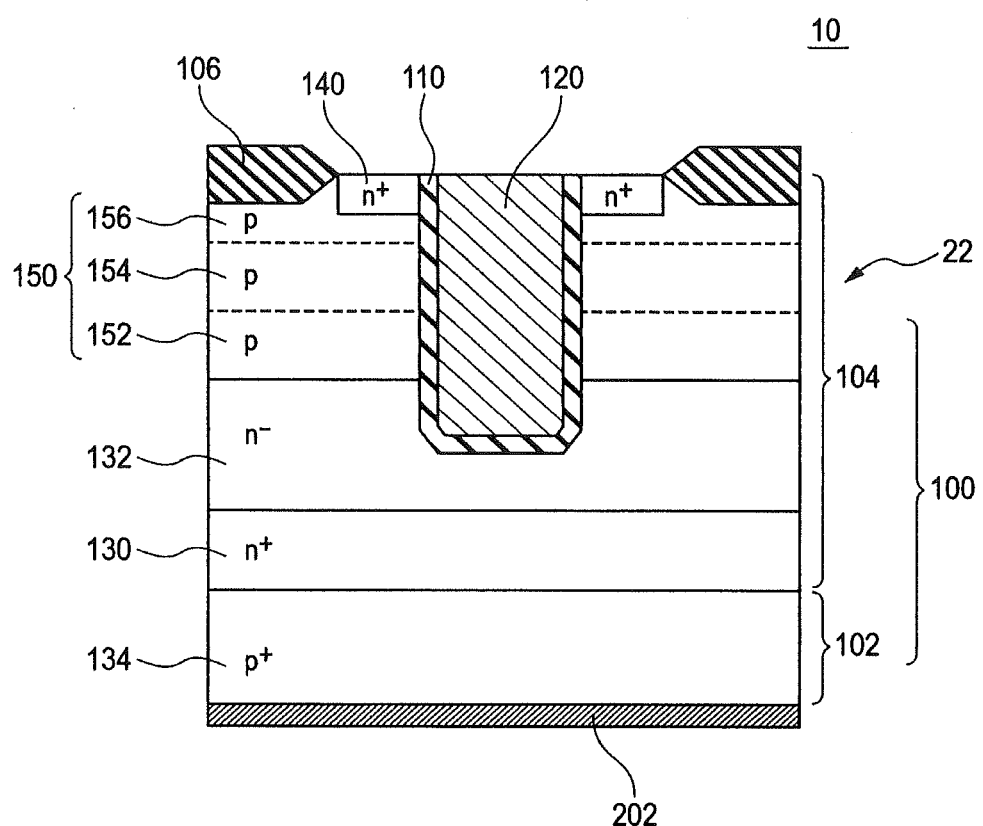
FIG. 15 is a sectional view showing the configuration of a semiconductor device according to Sixth Embodiment.

FIG. 15 is a sectional view showing the configuration of a semiconductor device 10 according to Sixth Embodiment. The semiconductor device 10 according to the present embodiment is similar to that according to any one of First to Fifth Embodiments except that it has an IGBT (Insulated Gate Bipolar Transistor) 22 instead of a vertical-type MOS transistor 20. The IGBT 22 has a configuration formed by adding a p-type collector layer 134 between an n-type drain layer 130 and a drain electrode 202 in a vertical-type MOS transistor 20.

In the present embodiment, a semiconductor substrate 102 is a p-type silicon substrate and functions as a p-type collector layer 134. Then an n-type drain layer 130 and an n.sup.−-type layer 132 are formed over the semiconductor substrate 102 by an epitaxial growth method.

A manufacturing method of the semiconductor device 10 according to the present embodiment is similar to a manufacturing method of a semiconductor device 10 according to First Embodiment except that a p-type silicon substrate is used as a semiconductor substrate 102 and an n-type drain layer 130 and an n.sup.−-type layer 132 are epitaxially grown over the semiconductor substrate 102 in this order.

In the present embodiment, effects similar to First Embodiment can be obtained.

Although embodiments according to the present invention have been explained above in reference to the drawings, they are the examples of the present invention and various configurations other than the above configurations can also be adopted.

The invention claimed is:

1. A semiconductor device comprising:
    a semiconductor substrate having a main surface and a back surface opposing to the main surface;
    a drain layer of a first conduction type formed on the back surface of said semiconductor substrate;
    a base layer of a second conduction type different from the first conduction type formed in said semiconductor substrate and provided over said drain layer;
    a recess formed in said base layer so that the bottom end of said recess is located lower than base layer;
    a gate insulation film formed over the inner wall of said recess;
    a gate electrode embedded into said recess; and
    a source layer of the first conduction type formed in said base layer so as to be shallower than said base layer and located next to said recess in a plan view,
    wherein said base layer includes, in an impurity profile in the thickness direction, three or more peaks, and
    wherein the impurity profile of said base layer in a thickness direction includes a first peak, a second peak being located closer to a bottom face side of said semiconductor substrate than said first peak and being higher than said first peak, and a third peak located between said first peak and said second peak.

2. A semiconductor device according to claim 1, wherein a peak of the main surface side is lower than a peak of the back surface side in an impurity profile in the thickness direction.

3. A semiconductor device according to claim 1, wherein the first conduction type comprises n-type and the second conduction type comprises p-type.

4. A semiconductor device according to claim 1, wherein the recess comprises a trench and the source layer is formed on opposite sides of the trench.

5. A semiconductor device according to claim 1, wherein a distance from a bottom of the base layer to a bottom of the source layer is at least 1.4 μm.

6. A semiconductor device according to claim 1, wherein an impurity concentration of the source layer is greater than an impurity concentration of the base layer.

7. A semiconductor device comprising:
    a semiconductor substrate;
    a drain layer of a first conduction type formed in said semiconductor substrate and located on the bottom face side of said semiconductor substrate;
    a drain electrode formed over the drain layer;
    a base layer of second condition type formed in said semiconductor substrate and located over said drain layer;
    a recess formed in said base layer so that the bottom end of said recess may be located lower than said base layer;
    a gate insulation film formed over the inner wall of said recess;
    a gate electrode embedded into said recess; and
    a source layer of the first conduction type formed in said base layer so as to be shallower than said base layer and located next to said recess in a planar view,
    wherein a collector layer of the second conduction type is formed between said drain layer and said drain electrode and,
    wherein said base layer includes, in an impurity profile in the thickness direction, a first peak, a second peak being located closer to the bottom face side of said semiconductor substrate than said first peak and being higher than said first peak, and a third peak located between said first peak and said second peak.

8. A semiconductor device according to claim 7, wherein said third peak is higher than said first peak and lower than said second peak.

9. A semiconductor device according to claim 7, wherein the distance from the bottom end of said base layer to said second peak is not more than one third the thickness of said base layer.

10. A semiconductor device according to claim 7, wherein the height of said second peak is not more than three times the height of said first peak.

11. A semiconductor device according to claim 7, wherein said semiconductor device includes a plurality of said second peaks.

12. A semiconductor device according to claim 7, wherein said semiconductor device includes a control circuit being formed over said semiconductor substrate and generating signals inputted into said gate electrode.

* * * * *